United States Patent
Leslie et al.

(10) Patent No.: US 11,626,145 B2
(45) Date of Patent: Apr. 11, 2023

(54) APPARATUSES AND METHODS FOR PULSE RESPONSE SMEARING OF TRANSMITTED SIGNALS

(71) Applicant: MICRON TECHNOLOGY, INC., Boise, ID (US)

(72) Inventors: Matthew B. Leslie, Boise, ID (US); Timothy M. Hollis, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 17/360,922

(22) Filed: Jun. 28, 2021

(65) Prior Publication Data

US 2022/0005512 A1 Jan. 6, 2022

Related U.S. Application Data

(60) Provisional application No. 63/047,378, filed on Jul. 2, 2020.

(51) Int. Cl.
*H04L 25/03* (2006.01)
*H04B 3/32* (2006.01)
*G11C 7/10* (2006.01)

(52) U.S. Cl.
CPC .......... *G11C 7/1048* (2013.01); *G11C 7/1063* (2013.01); *H04B 3/32* (2013.01);
(Continued)

(58) Field of Classification Search
CPC . H04B 3/04; H04B 3/06; H04B 3/142; H04B 3/20; H04B 3/23; H04B 3/231;
(Continued)

(56) References Cited

U.S. PATENT DOCUMENTS 8,442,099 B1 * 5/2013 Sederat ............... H04B 3/32
375/220
2003/0067996 A1 * 4/2003 Schenk ................ H04L 25/497
375/232

(Continued)

FOREIGN PATENT DOCUMENTS

EP         1396943 A1      3/2004

OTHER PUBLICATIONS

Shih-Yuan Kao and Shen-luan Liu "A 7.5-Gb/s One-Tap-FFE Transmitter With Adaptive Far-End Crosstalk Cancellation Using Duty Cycle Detection," IEEE Journal of Solid-State Circuits. vol. 48, No. 2. Feb. 2013.*

(Continued)

*Primary Examiner* — Young T. Tse
(74) *Attorney, Agent, or Firm* — Dorsey & Whitney LLP

(57) ABSTRACT

Embodiments of the disclosure include signal processing methods to reduce crosstalk between signal lines of a channel bus using feed forward equalizers (FFEs) configured smear pulse response energy transmitted on signal lines of the channel to reduce pulse edge rates. The coefficients for the FFE may be based on crosstalk interference characteristics. Smearing or spreading pulse response energy across a longer time period using a FFE increases inter-symbol interference (ISI). To counter increased inter-symbol interference caused by smearing pulse response energy, receivers configured to recover symbol data transmitted on the channel bus may each include respective decision-feedback equalizers (DFEs) that are configured to filter ISI from transmitted symbols based on previous symbol decisions of the channel. The combination of the FFE configured to smear pulse responses and the DFE to filter ISI may improve data eye quality for recovery of transmitted data on a channel bus when crosstalk dominates noise.

20 Claims, 7 Drawing Sheets

(52) U.S. Cl.
CPC .. *H04L 25/03076* (2013.01); *H04L 25/03146* (2013.01); *H04L 25/03267* (2013.01); *H04L 25/03878* (2013.01)

(58) Field of Classification Search
CPC .......... H04B 3/235; H04B 3/237; H04B 3/32; H04L 25/03006; H04L 25/03019; H04L 25/03076; H04L 25/03146; H04L 25/03267; H04L 25/03878; H04L 25/03885; H04L 27/01; H04L 2025/03433
USPC ........ 375/219, 220, 229, 232, 233, 257, 295
See application file for complete search history.

(56) References Cited

U.S. PATENT DOCUMENTS

| | | |
|---|---|---|
| 2006/0140287 A1 | 6/2006 | Alon et al. |
| 2009/0080325 A1 | 3/2009 | Parnaby |
| 2009/0285271 A1* | 11/2009 | Perez De Aranda Alonso ............ H04L 27/2613 375/296 |
| 2010/0177815 A1 | 7/2010 | Garg et al. |
| 2015/0117635 A1 | 4/2015 | Ho et al. |
| 2019/0044813 A1* | 2/2019 | Oksman ................ H04L 47/762 |

OTHER PUBLICATIONS

ISR/WO dated Oct. 21, 2021 for PCT Appl. No. PCT/US2021/039435.

* cited by examiner

APPARATUSES AND METHODS FOR PULSE RESPONSE SMEARING OF TRANSMITTED SIGNALS

CROSS-REFERENCE TO RELATED APPLICATION

This application claims the filing benefit of U.S. Provisional Application No. 63/047,378, filed Jul. 2, 2020. This application is incorporated by reference herein in its entirety and for all purposes.

BACKGROUND

High data reliability, high speed of memory access, lower power consumption and reduced chip/package size are features that are demanded from semiconductor memory. Data transmitted on multi-channel buses may be filtered to equalize a channel response for each channel. However, as circuit designs become more compact and as data rates increase, crosstalk between transmitted signals may become a significant contributor to noise during data transmissions, and channel response equalization may enhance the crosstalk, in some examples. The increased contribution to noise by channel crosstalk may limit an ability to further reduce physical characteristics of semiconductor devices, packages, or modules and/or may limit a data rate for the multi-channel buses.

DETAILED DESCRIPTION

Figure 1:
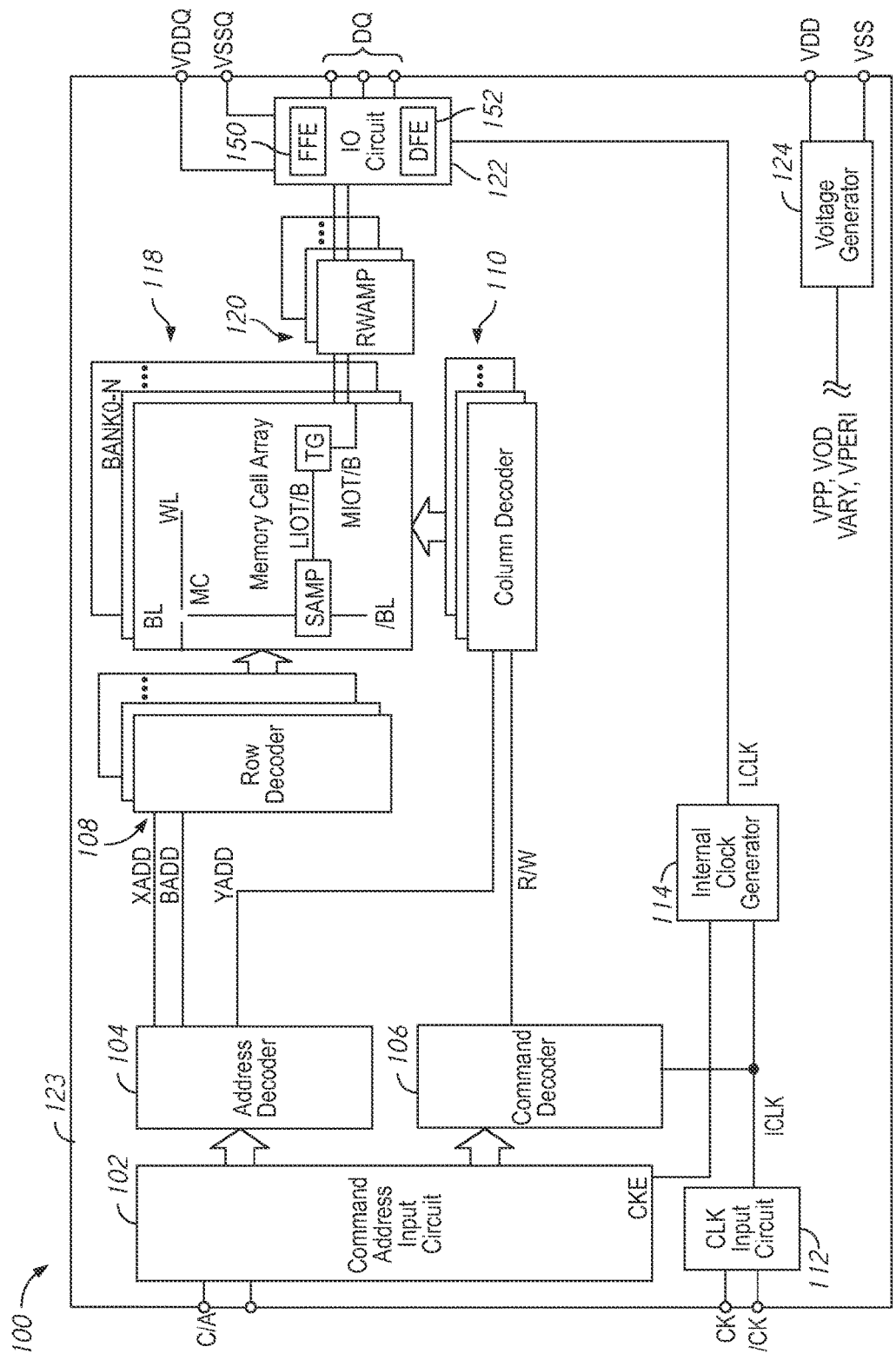
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

This disclosure describes signal processing methods to reduce crosstalk between transmission of data over a channel via a multi-signal line channel bus used to communicate between devices or nodes. In some examples, feed forward equalizers (FFEs) may be configured to condition channel data transmitted on respective signals lines of the channel bus to reduce crosstalk noise (e.g., electromagnetic interference) between channel data transmitted over the channel via the signal lines. Noise includes any error or undesired random disturbance of data transmitted on a channel. Thus, an increased level of noise may affect quality of a transmitted signal on a channel, such that an ability to reliably recover data transmitted on the channel may be reduced. Noise may include disturbances from external sources (e.g., from other components or devices emitting electromagnetic energy), disturbances directly associated with physical characteristics of a channel (e.g., a channel response, which may be characterized by a transfer function), disturbances caused by crosstalk between signal lines of the channel bus, or any combination thereof. In some examples, when a FFE is configured to pre-emphasize or post-emphasize pulse responses to equalize a channel response of a particular signal line of the channel (e.g., FFE tap coefficients selected to generate a filter with an inverse transfer function of the channel), the resulting transmitted signal on the channel may increase crosstalk between physically-adjacent signal lines due to the high-pass filter effect of emphasis or amplification of some pulse responses, which may adversely affect performance of a multi-signal line bus associated with a channel susceptible to channel crosstalk. Additionally, effects of crosstalk may become more severe as data rates increase. If the FFE is configured to smear (e.g., dampen and/or spread energy over a longer time period) pulse responses transmitted on a channel to reduce pulse edge rates, the resulting crosstalk between channels may be reduced. Smearing or spreading pulse response energy across a longer time period using a FFE may increase inter-symbol interference (ISI), in some examples, which may negatively impact an ability to reliably recover transmitted symbol data. Thus, there is a tradeoff between smearing the pulse responses to reduce crosstalk with increasing ISI. To counter the increased ISI, receivers configured to recover symbol channel data transmitted on the multi-signal line bus may each include respective decision-feedback equalizers (DFEs) that are configured to filter ISI from transmitted symbols. DFEs may filter ISI from a channel based on a set of previous symbol decisions of the channel. The combination of the FFE configured to smear pulse responses and the DFE to filter ISI from a transmitted channel may improve data eye quality for recovering transmitted channel data from a multi-signal line bus when channel crosstalk is a significant contributor to signal noise.

FIG. 1 is a block diagram of a semiconductor device according to at least one embodiment of the disclosure. The semiconductor device 100 may be a semiconductor memory device, such as a dynamic, random-access memory (DRAM) device (e.g., double data rate (DDR) 4 DRAM, DDR5 DRAM, DDR6 DRAM, etc.) integrated on a single semiconductor chip. The example device 100 of FIG. 1 may include a memory package such as the stack of memory dies of memory dies positioned on a substrate 123, which may function as (and may be referred to) as an interface. Although certain components are shown in the memory dies of the stack of memory dies, and certain components on the substrate 123, other arrangement of the components of the device 100 between the stack of memory dies and the substrate 123 are possible in other example embodiments. In some embodiments, the device 100 may include multiple stacks of memory dies. In other embodiments, the stack of memory dies may include a single die.

For brevity and clarity of illustration, only the components of one memory die in the stack of memory dies are shown in FIG. 1. Generally, the different dies of the stack of memory dies may each have similar components to each other. In some embodiments, each die of the stack of memory dies may be physically identical to each other. The substrate 123 may act as an interface, and may send and receive information (e.g., data, commands) to and from the outside, while the memory dies in the stack of memory dies communicate with components of the substrate. As described herein, commands and other signals sent by the substrate 123 may be sent to all memory dies in the stack of memory dies or may be separately addressed to individual memory dies of the stack of memory dies.

The semiconductor device 100 includes a memory array 118. The memory array 118 may be positioned in a die of the stack of memory dies. The memory array 118 is shown as including a plurality of memory banks. In the embodiment of FIG. 1, the memory array 118 is shown as including N+1 memory banks BANK0-N, where N is any integer value, such as 2, 4, 8, 16, 32, etc. Each of the memory banks BANK0-N may include a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. The row and column decoders 108 and 110 may also be positioned in the memory dies of the stack of memory dies. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to receive and provide channel data (e.g., via a multi-signal line channel data bus), and power supply terminals to receive power supply potentials VDD, VSS, VDDQ, and VSSQ. The external terminals may be positioned on the substrate 123.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. In some embodiments, the address decoder 104 may also indicate a particular memory die of the stack of memory dies for activation. The C/A terminals may be supplied with commands Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The semiconductor device 100 may receive an access command which is a read command. When a read command is received, and a bank address, a row address and a column address (and optional die address) are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The semiconductor device 100 may receive an access command which is a write command. When the write command is received, and a bank address, a row address and a column address (and optional die address) are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

In some examples, the input/output circuit 122 may include a respective transmitter and/or a respective receiver coupled to each of the data terminals DQ. The transmitters may be configured to transmit read data to the channel data bus via the data terminals DQ and the receivers may be configured to receive write data from the channel data bus via the data terminals DQ. The channel data bus may include multiple signal lines. The channel bus may facilitate communication of channel data between one or more of the dies of the stack of memory dies and an external device, such as a memory module controller, a memory controller, another semiconductor device, a processor, or any other semiconductor device. In some examples, the physical characteristics (e.g., trace width, trace arrangement and separation, conductive material, voltage levels of the channel, etc.) of the channel bus having multiple signal lines may result in noise that is heavily dominated by channel crosstalk (e.g., electromagnetic interference between the channels). To reduce noise caused by channel crosstalk, the transmitters of the input/output circuit 122 may each include a respective transmit FFE TxFFE 150 that is configured to smear (e.g., dampen and/or spread energy over a longer time period) pulse responses on a respective channel to reduce pulse response slew or edge rates. In some examples, each TxFFE 150 may be configured to smear the pulse responses based on selected coefficients applied to each tap of the TxFFE 150. In some examples, each TxFFE 150 may include 2 or more taps. In a two-tap FFE example configured to smear a pulse response, both of the TxFFE 150 taps coefficients may be set to a positive value to cause the pulse response energy to spread or smear over a larger time period with reduced pulse response slew or edge rates. The reduced pulse response slew or edge rates may reduce channel crosstalk.

One side-effect of smearing the pulse response using an FFE will include an increase in ISI between adjacent symbols of a channel, in some examples. Thus, to mitigate effects of increased ISI when the pulse response energy of the data transmitted to the data terminals DQ of the semiconductor device 100 are smeared using a FFE similar to the TxFFEs 150, the receivers of the input/output circuit 122 may include respective receive DFEs RxDFEs 152 for each signal line of the channel bus to filter at least some ISI from transmitted symbols. The RxDFEs 152 may filter the ISI based on a set of previous symbol decisions to recover channel data transmitted over the channel bus with multiple signal line. The set of previous symbol decisions may include 2 or more previous decisions. Each of the RxDFEs 152 may apply a respective weight to each previous symbol decision of the set of previous symbol decisions and combine the weighted previous symbol decisions with the current symbol to recover the current symbol. The combination of the TxFFEs 150 configured to smear pulse responses of transmitted signals and the RxDFEs 152 to filter ISI from received signals may improve data eye quality for recovering transmitted channel symbol data on a multi-signal line channel bus, including when channel noise is heavily influenced by channel crosstalk. In some examples, the command address input circuit 102 may include RxDFEs similar to the RxDFEs 152 to filter ISI from received command and address signals received via the command and address bus.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
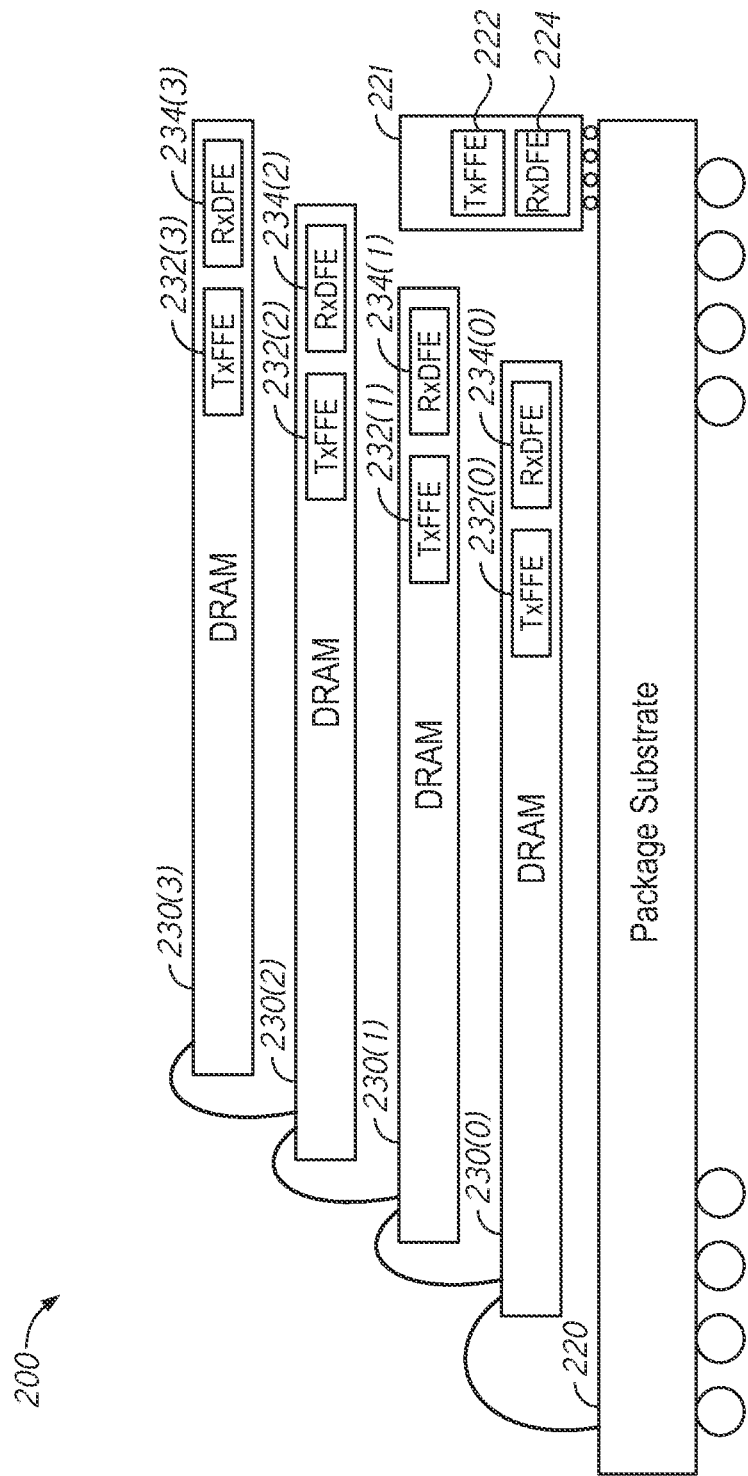
FIG. 2 is a block diagram of a memory package according to an embodiment of the present disclosure.

FIG. 2 is a block diagram of a memory package 200 according to an embodiment of the present disclosure. The memory package 200 may be an implementation of the semiconductor device 100 and stack of memory dies of FIG. 1, in some examples. The memory package 200 is an example representing one possible organization of memory dies (and a substrate/interface) into a memory package which may be used in a memory device. The memory package 200 includes a package substrate 220, which includes terminals which send and receive information to other components outside the memory package 200. The package 200 also includes a logic die 221 and memory die 203(0)-(3). The logic die 221 may be configured to send signals to and receive signals from each of the memory die 203(0)-(3) and to send signals to and receive signals from one or more external sources. The memory die 203(0)-(3) may each be configured to send signals to and receive signals from an adjacent die, with the memory die 230(0) configured to send signals to and receive signals from the logic die 221.

Examples that are generally similar to the structure of the memory package 200 may be referred to as 3DS packages, and each of the dies may generally be referred to as a logical rank. The memory package 200 of FIG. 2, illustrates an example embodiment with 4 different memory die 230(0)-(3). In other examples, more or fewer memory dies may be used. For example, some memory stacks may include 8 or 2 memory dies.

The package substrate 220 and the logic die 221 and/or the memory die 230(0)-(3) may be coupled to each other using one or more of a variety of methods. In some embodiments, the package substrate 220 and logic die 221 and/or the memory die 230(0)-(3) may be coupled together with wire bonds. In some embodiments, the package substrate 220 and logic die 221 and/or the memory die 230(0)-(3) may be coupled together using through silicon vias (TSVs). In a 3DS package, there may be an additional power constraint based on the peak power (and/or current) which may be pulled through the couplings between the package substrate 220 and logic die 221 and/or the memory die 230(0)-(3) (e.g., the wire bonds and/or TSVs).

The memory package 200 may include many of the same components as the semiconductor package 100 of FIG. 1 distributed between the package substrate 220, the logic die 221, and/or each of the memory die 230(0)-(3). In some examples, the package substrate 220, the logic die 221, and/or each of the memory die 230(0)-(3) may include an input/output circuit (e.g., the input/output circuit 122 of FIG. 1) for transmitting and receiving channel data via a channel bus having multiple signal lines.

To accommodate command, address, and/or data transmission and reception over one or more channel buses (e.g., bus for communication to and from an external device and/or bus for communication to and from one or more of the memory die 230(0)-(3)), the logic die 221 may include one or more TxFFEs 222 and/or one or more RxDFEs 224, in some examples. For a given channel bus with multiple signal lines, a number of the TxFFEs 222 may be based on a number of signal lines of the channel bus on which channel data are transmitted and a number of the RxDFEs 224 may be based on a number of signal lines of the channel bus on which channel data are received.

In some examples, each of the memory die 230(0)-(3) may include respective TxFFEs 232(0)-(3) and/or respective RxDFEs 234(0)-(3) to facilitate signal transmission and reception over one or more channel buses (e.g., bus for command, address, and/or data communication to or from one or more of the memory die 230(0)-(3) and/or bus for command, address, and/or data communication to or from an external device via the package substrate 220 and/or logic die 221). For a given channel bus that includes multiple signal lines for providing channel data to and/or from one of the memory die 230(0)-(3), a respective number of the TxFFEs 232(0)-(3) may be based on a number of signal lines of the channel bus on which signals are transmitted and a respective number of the RxDFEs 234(0)-(3) may be based on a number of signal lines of the channel bus on which channel data are received.

In some examples without departing from the scope of the disclosure, only the logic die 221 may include the TxFFEs 222 and the RxDFEs 224, with the memory die 230(0)-(3) transmitting and receiving data without use of the respective TxFFEs 232(0)-(3) and/or the respective RxDFEs 234(0)-(3). In some examples without departing from the scope of the disclosure, only the memory die 230(0)-(3) include the respective TxFFEs 232(0)-(3) and/or the respective RxDFEs 234(0)-(3), with the logic die 221 transmitting and receiving data without use of the TxFFEs 222 and the RxDFEs 224.

The foregoing describes operation of a TxFFE that may be applied to any one of the TxFFEs 222 and/or the respective TxFFEs 232(0)-(3) and describes operation of a RxDFE that may be applied to any of the RxDFEs 224 and/or the RxDFEs 234(0)-(3). In some examples, the physical characteristics (e.g., trace width, trace arrangement and separation, conductive material, voltage levels of the channel bus, etc.) of signal lines of the channel bus may result in noise that is heavily dominated by channel crosstalk (e.g., electromagnetic interference between the channels). To reduce noise caused by channel crosstalk, the TxFFE may be configured to smear (e.g., dampen and/or spread over a longer time period) pulse responses on a respective channel to reduce pulse edge rates. In some examples, the TxFFE may be configured to smear the pulse responses based on selected coefficients applied to each tap of the TxFFE. In some examples, the TxFFE may include 2 or more taps. In a two-tap TxFFE example configured to smear a pulse response, both of the TxFFE taps coefficients may have a positive value to cause the pulse response energy to smear or spread over a larger time period with a reduced pulse response slew or edge rates. The reduced pulse response slew or edge rates may reduce crosstalk between channels.

One side-effect of smearing the pulse response using a TxFFE will include an increase in ISI between adjacent symbols of a channel, in some examples. Thus, to mitigate effects of increased ISI when the pulse response energy of the signals transmitted to or within the memory package 200 are smeared using a TxFFE, receivers may include respective RxDFEs for each signal line of the channel bus to filter at least some ISI from transmitted symbols. The RxDFEs may filter the ISI based on a set of previous symbol decisions to recover data transmitted over the channel. The set of previous symbol decisions may include 2 or more previous decisions. Each of the RxDFEs may apply a respective weight to each previous symbol decision of the set of previous symbol decisions and combine the weighted previous symbol decisions with the current symbol to recover the current symbol. The combination of the TxFFEs 222 and/or the respective TxFFEs 232(0)-(3) configured to smear pulse responses of transmitted signals and the RxDFEs 224 and/or the RxDFEs 234(0)-(3) to filter ISI from received signals may improve data eye quality for recovering transmitted symbol data on a channel bus, including when noise is heavily influenced by channel crosstalk.

Figure 3:
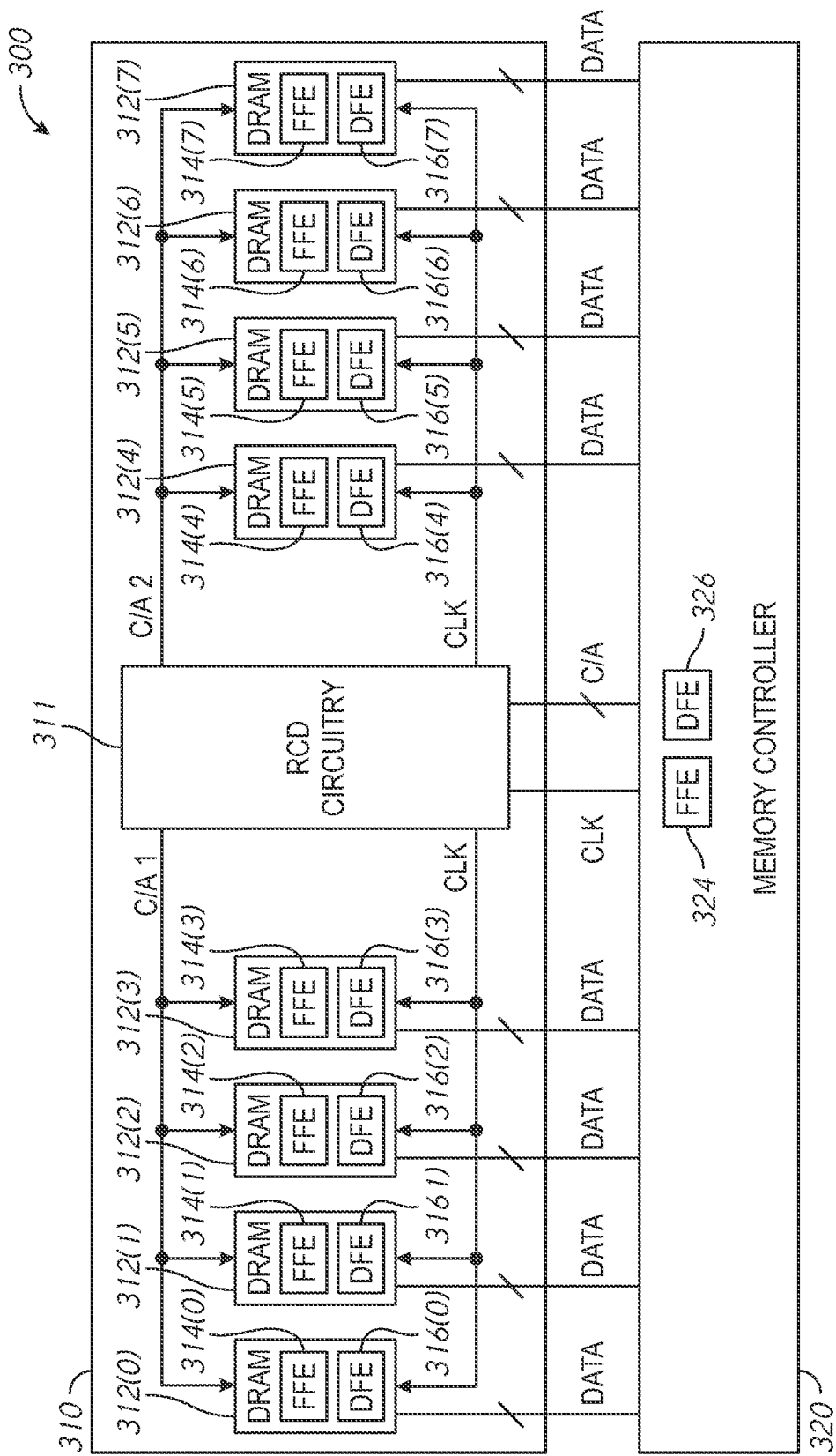
FIG. 3 is a block diagram of a memory system 300 including a memory module according to an embodiment of the present disclosure.

FIG. 3 is a block diagram of a memory system 300 including a memory module 310 according to an embodiment of the present disclosure. The memory module 310 may include memories 312(0)-(7) coupled to register clock driver (RCD) circuitry 311. Each of the memories 312(0)-(7) may include memory packages and/or memory devices. The memory module 310 may be configured to communicate with a memory controller 320 to perform memory access operations based on a clock signal CLK, command and address data received via at least one command and address bus C/A, and/or channel data transferred via respective channel data buses.

In some examples, the memory controller 320 may include TxFFEs 322 configured to smear pulse responses of channel data transmitted via respective signal lines of the channel data bus and/or the C/A bus to the memory controller 320 and/or RxDFEs 324 configured to filter ISI from signals received from the memory module 310 via the multi-channel data buses. For a given channel bus, a number of the TxFFEs 322 may be based on a number of signal lines of the channel bus on which channel data are transmitted and a number of the RxDFEs 324 may be based on a number of signal lines of the channel bus on which channel data are received.

In some examples, the memories 312(0)-(7) may all be the same type of memory. In other examples, the memories 312(0)-(7) may be a mix of different types of memories. In some examples, each of the memories 312(0)-(7) may implement the semiconductor device 100 of FIG. 1, the memory package 200 of FIG. 2, or any combination thereof. The memory module 310 may include a dual, inline memory module (DIMM), including a registered DIMM, a load reduction DIMM (LRDIMM), a micro DIMM, non-volatile DIMM (NVDIMM) (e.g., including non-volatile memory and a controller (not shown)), or any other type of DIMM. Although the memory module 300 shown in FIG. 3 having 8 memories 312(0)-(7), more or fewer memories may be used in other embodiments. In some examples, the memory module 310 may include an additional memory (not shown) that is used for error correcting code (ECC) storage.

In some embodiments, the memories 312(0)-(7) may be organized into different physical ranks and/or may be included on one or both sides of the memory module 310. In some embodiments, there may be 8, 16, or more memories per physical rank, and one or more physical ranks in the memory module 310. For example, the memory module 310 may include a first physical rank on a first side of the memory module 310 (e.g., the 8 memories 312(0)-(7)), and a second physical rank on a back side of the memory module 310 (e.g., 8 more memories on a reverse side of the memory module 310).

The RCD circuitry 311 may be configured to communicate with the memory controller 320 to receive a clock signal CLK and to receive command and address signals over at least one command/address bus C/A. The RCD circuitry 311 may be configured to provide the CLK signal to each of the memories 312(0)-(7) and to provide the command and address data to the memories 312(0)-(7) In some examples, the C/A bus may include two separate buses to communicate two sets of command and address data in parallel. In this example, the RCD circuitry 311 may be configured to provide the first set of command and address data to the memories 312(0)-(3) via a first C/A bus C/A 1 of the memory module 310 and to provide the second set of command and address data to the memories 312(4)-(7) via a second C/A bus C/A 2 of the memory module 310. The RCD circuitry 311 may further include circuitry to store and provide information about the memory module 310, such as number of memories, number of ranks, types of memory, configuration information for the memory module 310, etc.

Each of the memories 312(0)-(7) may be configured to communicate with a memory controller 320 via a respective channel data bus having multiple signal lines to receive and send data during access operations performed according to the command and address data received from the RCD circuitry 311 via the C/A 1 and C/A 2 buses, respectively. Each of the memories 312(0)-(7) may include respective TxFFEs 314(0)-(7) configured to smear pulse responses of channel data transmitted on respective signal lines of the channel data bus to the memory controller 320 and/or respective RxDFEs 316(0)-(7) configured to filter ISI from channel data received from the memory controller 320 via the channel data bus. For a given channel bus providing communication to and/or from one of the memories memory module 310(0)-(7), a respective number of the TxFFEs 314(0)-(7) may be based on a number of signal lines of the channel bus on which channel data are transmitted and a respective number of the RxDFEs 316(0)-(7) may be based on a number of signal lines of the channel bus on which signals are received.

The foregoing describes operation of a TxFFE that may be applied to any of the TxFFEs 322 and/or the respective TxFFEs 314(0)-(7) and describes operation of a RxDFE that may be applied to any of the RxDFEs 324 and/or the RxDFEs 316(0)-(7). In some examples, the physical characteristics (e.g., trace width, trace arrangement and separation, conductive material, voltage levels of the channel, etc.) of signal lines of the channel bus may result in noise that is heavily dominated by channel crosstalk (e.g., electromagnetic interference between the signal lines). To reduce noise caused by channel crosstalk, the TxFFE may be configured to smear (e.g., dampen and/or spread over a longer time period) pulse responses on a respective signal line to reduce pulse edge rates. In some examples, the TxFFE may be configured to smear the pulse responses based on selected coefficients applied to each tap of the TxFFE. In some examples, the TxFFE may include 2 or more taps. In a two-tap TxFFE example configured to smear a pulse response, both of the TxFFE taps coefficients may have a positive value to cause the pulse response energy to smear or spread over a larger time period with a reduced pulse response slew or edge rates. The reduced pulse response slew or edge rates may reduce crosstalk between channels.

One side-effect of smearing the pulse response using a TxFFE will include an increase in ISI between adjacent symbols of a channel, in some examples. Thus, to mitigate effects of increased ISI when the pulse response energy of the signals transmitted to or within the memory module 310 and/or to the memory controller 320 are smeared using a TxFFE, receivers may include respective RxDFEs for each signal lines of the channel bus to filter at least some ISI from transmitted symbols. The RxDFEs may filter the ISI based on a set of previous symbol decisions to recover data transmitted over the channel bus. The set of previous symbol decisions may include 2 or more previous decisions. Each of the RxDFEs may apply a respective weight to each previous symbol decision of the set of previous symbol decisions and combine the weighted previous symbol decisions with the current symbol to recover the current symbol. The combination of the TxFFEs 322 and/or the respective TxFFEs 314(0)-(7) configured to smear pulse responses of transmitted signals and the RxDFEs 324 and/or the respective RxDFEs 316(0)-(7) to filter ISI from received signals may improve data eye quality for recovering transmitted symbol data on a channel bus, including when noise is heavily influenced by channel crosstalk.

Figure 4:
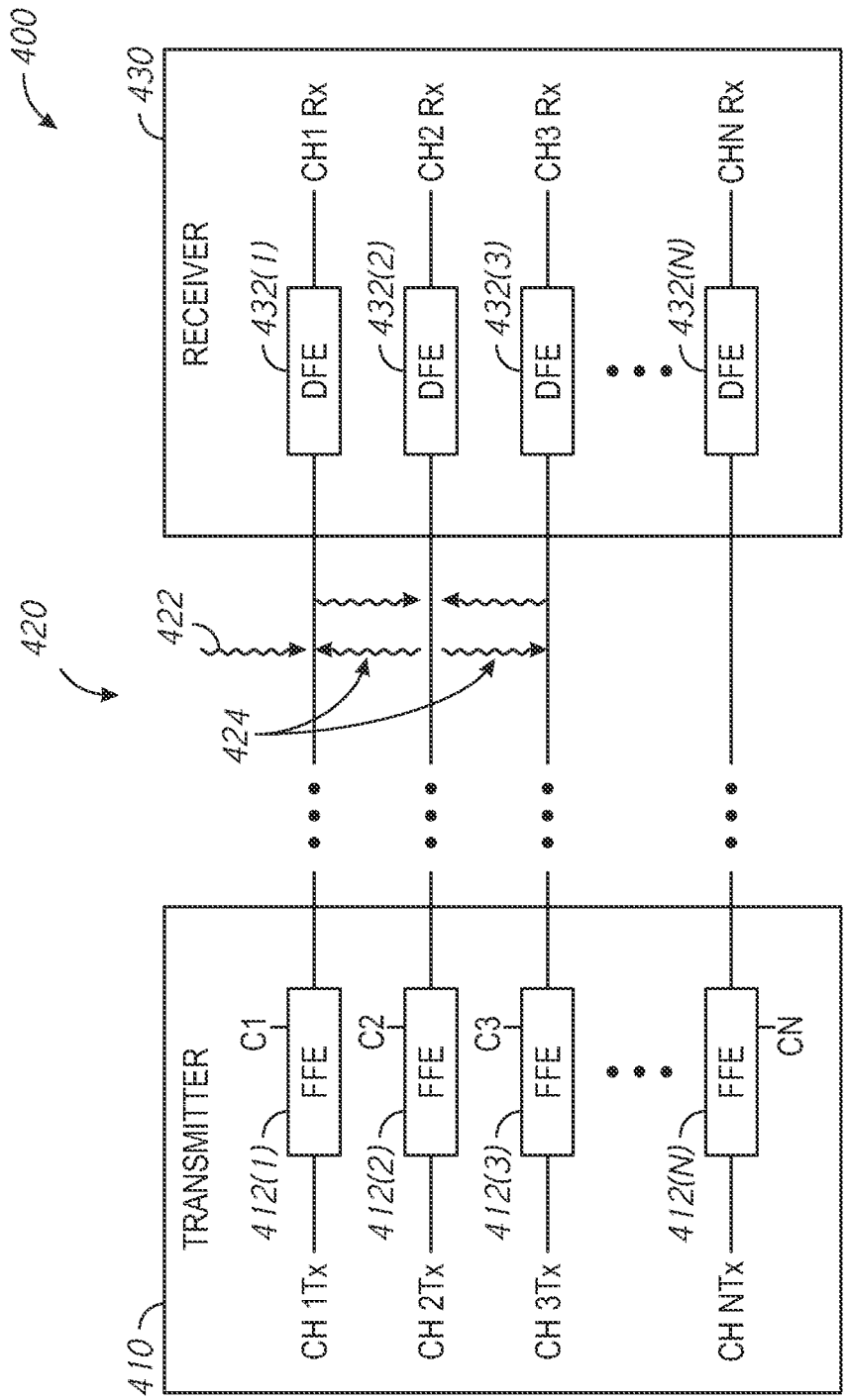
FIG. 4 is a block diagram of a system for communicating over a multi-channel bus between a transmitter and a receiver according to an embodiment of the present disclosure.

FIG. 4 is a block diagram of a system 400 for communicating over a multi-channel bus 420 between a transmitter 410 and a receiver 430 according to an embodiment of the present disclosure. The transmitter 410 may be included in any of the input/output circuits 122 of FIG. 1, any of the logic die 221 or the memory die 230(1)-(3) of FIG. 2, and/or any of the memories 312(0)-(7) or the memory controller 320 of FIG. 3. The channel bus 420 may be included in any of the command address input circuit 102 or the input/output circuits 122 of FIG. 1, any of the logic die 221 or the memory die 230(1)-(3) of FIG. 2, and/or any of the RCD circuitry 311, the memories 312(0)-(7), or the memory controller 320 of FIG. 3.

The multi-channel bus 420 may include N channels, where N is any number greater than 2. While FIG. 4 depicts the channel bus 420 as having at least 4 signal lines, the channel bus 420 may be implemented with more or fewer than 4 signal lines without departing from the scope of the disclosure.

During transmission of signals over respective signal lines of the multi-signal line bus 420, signal quality may be affected by external interference 422 from external sources, as well as crosstalk interference (e.g., electromagnetic interference) 424. In some examples, the physical characteristics (e.g., trace width, trace separation, conductive material, voltage levels of the channel bus, etc.) of signal lines of the channel bus 420 may make the channel bus 420 more susceptible to the crosstalk interference 424 between signal lines of the channel bus 420 as a significant contributor to noise between the channels, as compared with the external interference.

Thus, to reduce the crosstalk interference 424, the transmitter 410 may include a respective TxFFE 412(1)-(N) that corresponds to each of the transmit signal lines CH1TX-CHNTX of the channel bus 420. Each of the TxFFEs 412(1)-(N) may be configured to smear (e.g., dampen and/or spread over a longer time period) pulse responses on a respective one of the CH1TX-CHNTX to reduce pulse response slew or edge rates via respective coefficient data C1-CN. Each of the C1-CN coefficient data includes an individual coefficient value for each tap of the TxFFEs 412(1)-(N). In some examples, each of the TxFFEs 412(1)-(N) may include 2 or more taps. In a two-tap TxFFE example configured to smear a pulse response, both of coefficients in the C1-CN data may have a positive value to cause the pulse response energy to spread or smear over a larger time period with a reduced pulse response slew or edge rates. The reduced pulse response slew or edge rates may reduce crosstalk between channels.

One side-effect of smearing the pulse response using the TxFFEs 412(1)-(N) may include an increase in ISI between adjacent symbols of a channel, in some examples. Thus, to mitigate effects of increased ISI when the pulse response energy of the channel data transmitted over the CH1-CHN signal lines of the channel bus 420 from the transmitter 410 are smeared using TxFFEs 412(1)-(N), the receiver 430 may include a respective RxDFE 432(1)-(N) for each receive signal line CH1RX-CHNRX of the channel bus 420. Each RxDFE 432(1)-(N) may filter the ISI based on a set of previous symbol decisions to recover data transmitted over the channel bus. The set of previous symbol decisions may include 2 or more previous decisions. Each RxDFE 432(1)-(N) may apply a respective weight to each previous symbol decision of the set of previous symbol decisions and combine the weighted previous symbol decisions with the current symbol to recover the current symbol. The combination of the TxFFEs 412(1)-(N) configured to smear pulse responses of transmitted signals and the RxDFEs 432(1)-(N) to filter ISI from received signals may improve data eye quality for recovering transmitted symbol data on a channel bus, including when noise is heavily influenced by channel crosstalk.

Figure 5:
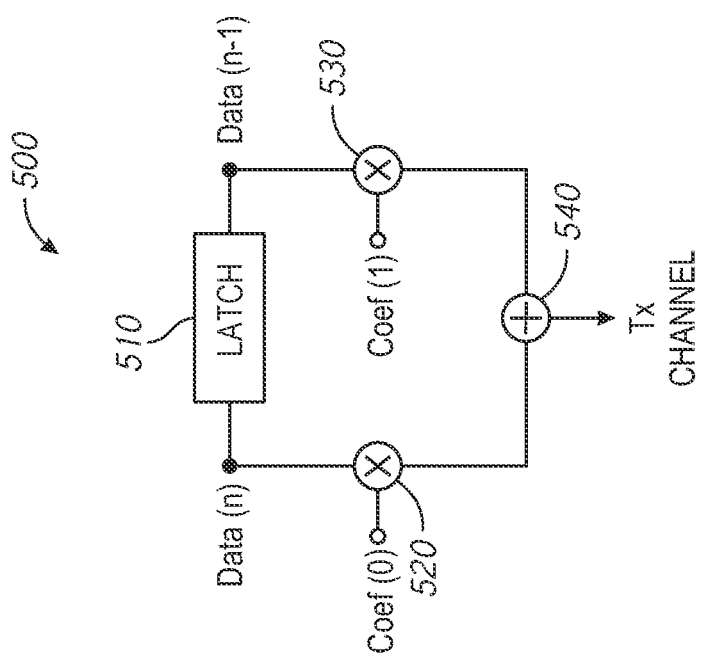
FIG. 5 is a block diagram of an exemplary feed forward equalizer (FFE) according to an embodiment of the present disclosure.

FIG. 5 is a block diagram of an exemplary FFE 500 according to an embodiment of the present disclosure. Any of The TxFFEs 150 of FIG. 1, any of the TxFFEs 222 and/or the TxFFEs 232(0)-(3) of FIG. 2, any of the TxFFEs 314(0)-(7) and/or the TxFFEs 322 of FIG. 3, and/or any of the TxFFEs 412(0)-(N) of FIG. 4 may implement the FFE 500.

The FFE 500 depicted in FIG. 5 is a two-tap FFE includes a first multiplier 520 and a second multiplier 530 with post-emphasis adjustment. The FFE 500 may be modified to apply pre-emphasis filtering or may be implemented with more than two taps that include any combination of pre and post emphasis without departing from the scope of the disclosure. The FFE 500 receive data(n) at the first multiplier 520 and at a latch 510. The latch 510 may apply a delay that is equal to a delay between symbols on the data signal. In some examples, the delay is controlled by a clock signal. Thus, when the data(n) is received at the input of the latch 510, data(n−1) is provided at an output of the latch 510. The first multiplier 520 combines modifies the data(n) based on a first coefficient coef(0) and the second multiplier 530 modifies the data(n−1) based on a second coefficient coef(1). The outputs of the first multiplier 520 and the second multiplier 530 are combined at the adder 540, which provides transmit data to a signal lines of a channel bus.

To reduce the crosstalk interference between signal lines of a channel bus, the coef(0) and the coef(1) may be set to smear (e.g., dampen and/or spread over a longer time period) pulse responses on the channel to reduce pulse response slew or edge rates. Thus, to spread or smear the pulse response energy for data(n), the coef(0) will apply a first filter to data(n) transmitted during a first time that is combined with the previous data(n−1) filtered according to the coef(1). During a next symbol period, the data(n) will become the data(n−1) to be filtered based on the coef(1) and combined with the next data(n) filtered based on the coef(0).

In examples where the FFE 500 is configured to smear a pulse response, both of coef(0) and coef(1) may have a positive value to cause the pulse response energy to spread or smear over a larger time period with a reduced pulse response slew or edge rates. The reduced pulse response slew or edge rates may reduce crosstalk between signal lines of a channel bus.

Figure 6:
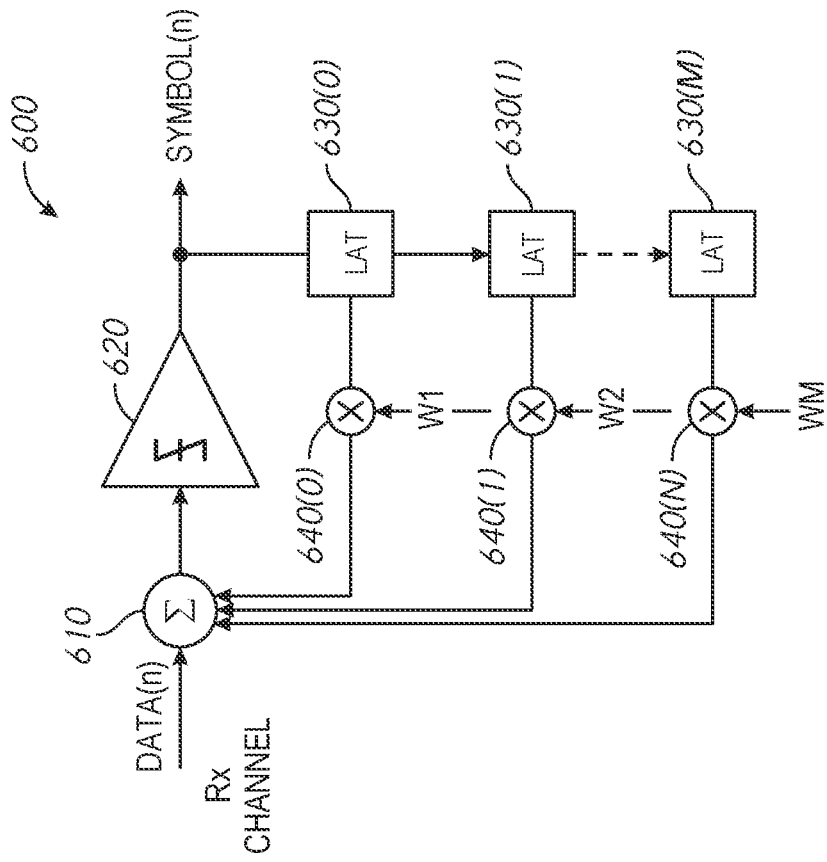
FIG. 6 is a block diagram of an exemplary decision feedback equalizer (DFE) according to an embodiment of the present disclosure.

FIG. 6 is a block diagram of an exemplary DFE 600 according to an embodiment of the present disclosure. Any of The RxDFEs 152 of FIG. 1, any of the RxDFEs 224 and/or the RxDFEs 234(0)-(3) of FIG. 2, any of the RxDFEs 316(0)-(7) and/or the RxDFEs 324 of FIG. 3, and/or any of the RxDFEs 432(0)-(N) of FIG. 4 may implement the DFE 600.

The DFE 600 depicted in FIG. 6 is an M-tap DFE with pairs of latches 630(0)-(M) and multipliers 640(0)-(M), where M is any number greater than 1. The DFE 600 receive data(n) at the adder 610 from the receive channel RX. The adder 610 may combine the data(n) with outputs of each of the multipliers 640(1)-(N) to provide an output to an amplifier/driver circuit 620. The amplifier/driver circuit 620 may include an amplifier and/or a driver to recover and drive a recovered data(n) symbol symbol(n). The output of the amplifier/driver circuit 620 is provided to the latches 630(0)-(M). The latches 630(0)-(M) may include sequentially-coupled delays that hold a set of previously-recovered symbols output from the amplifier/driver circuit 620. The delay of each of the latches 630(0)-(M) may be one symbol period. Thus, when data(n) is received, the latch 630(0) stores symbol(n−1), the latch 630(1) stores symbol(N−2), and so on. After a delay has elapsed or in response to a clock signal, each of the latches 630(0)-(M−1) provides a currently stored symbol to a subsequent one of the latches 630(1)-(M). In addition, each of the latches 630(0)-(M) provides a currently stored symbol to a respective one of the multipliers 640(0)-(M). Each of the multipliers 640(0)-(M) multiply a received symbol with a respective weight value W0-WM to provide an output to the adder 610. In some examples, the W0-WM may become progressively smaller from W0 to WM such that older symbols have less influence on an output of the adder 610 than more recently received symbols. Thus, the combination of the data(n) signal with data based on a set of previous symbol decisions provided from the outputs of the multipliers 640(0)-(M) may reduce ISI and allow more reliable recovery of transmitted symbols.

Figure 7:
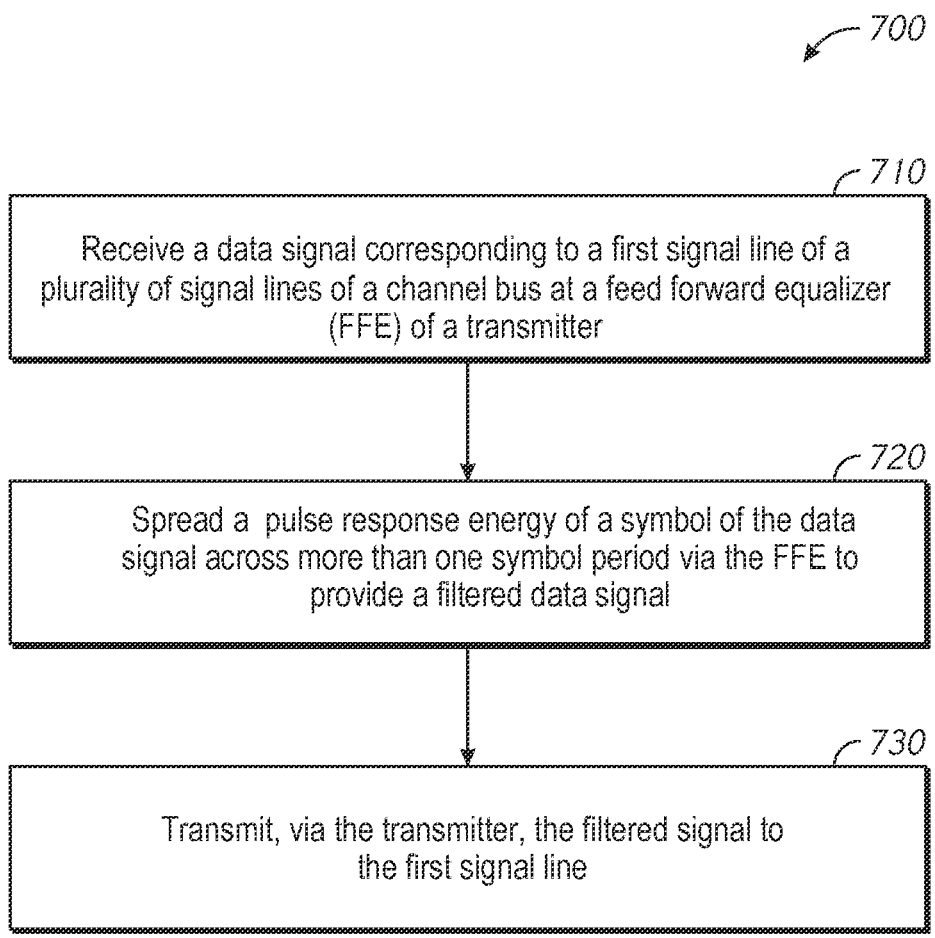
FIG. 7 is a flow diagram of a method 700 for smearing pulse response energy using a feed forward equalizer according to an embodiment of the present disclosure.
Figure 8:
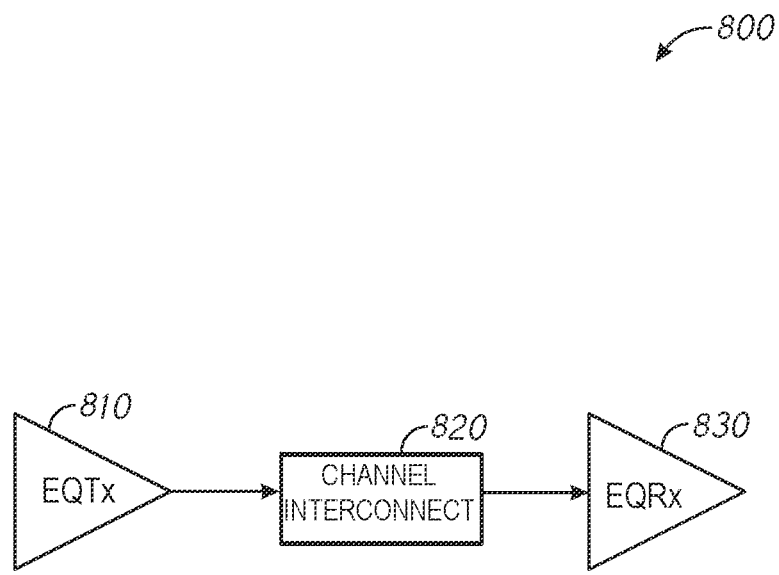

FIG. 7 is a flow diagram of a method 700 for smearing pulse response energy using a feed forward equalizer according to an embodiment of the present disclosure. The method 700 may be performed by any of the 150 of FIG. 1, any of the TxFFEs 222 and/or the TxFFEs 232(0)-(3) of FIG. 2, any of the TxFFEs 314(0)-(7) and/or the TxFFEs 322 of FIG. 3, any of the TxFFEs 412(0)-(N) of FIG. 4, the FFE 500 of FIG. 5, or any combination thereof.

The method 700 may include receiving a data signal corresponding to a first signal line of a plurality of signal lines of a channel bus at a feed forward equalizer (FFE) of a transmitter, at 710. Configuration of the FFE is based on a crosstalk interference characteristic of the channel bus. The channel bus may include any channel bus described with reference to FIGS. 1-5. The transmitter may include a transmitter of the input/output circuit 122 of FIG. 1, a transmitter of any of the logic die 221 or the memory die 230(0)-(3) of FIG. 2, a transmitter of any of the memories 312(0)-(7) or the memory controller 320 of FIG. 3, and/or the transmitter 410 of FIG. 4 of Figure The method 700 may further include spreading a pulse response energy of a symbol of the data signal across more than one symbol period via the FFE to provide a filtered data signal, at 720. The filtered data signal may have a reduced pulse edge rate. In some examples, the physical characteristics (e.g., trace width, trace arrangement and separation, conductive material, voltage levels of the channel bus, etc.) of the plurality of signal lines of the channel bus may result in noise that is heavily dominated by channel crosstalk (e.g., electromagnetic interference between the channels). To reduce noise caused by channel crosstalk, the FFE may be configured to smear (e.g., dampen and/or spread over a longer time period) pulse responses on a respective channel to reduce pulse slew or edge rates. In some examples, the FFE may be configured to smear the pulse responses based on selected coefficients applied to each tap of the FFE. In some examples, the FFE may include 2 or more taps.

In some examples, the method 700 may include applying a first coefficient to the pulse response energy of the symbol to provide a first filtered symbol for transmission during a first symbol period and applying a second coefficient to the pulse response energy of the symbol to provide a second filtered symbol for transmission during a second symbol period to spread the pulse response energy. The first symbol period may be a time period associated with the symbol and the second symbol period may be a time period associated with a subsequent symbol, in some examples. In a two-tap FFE example configured to smear a pulse response, both of the FFE taps coefficients may have a positive value to cause the pulse response energy to smear or spread over a larger time period with a reduced energy. In some examples, the method 700 may further include selecting the first and second coefficients based on the crosstalk interference characteristic of the channel bus.

In some examples, the method 700 may include applying a third coefficient to the pulse response energy of the symbol to provide a third filtered symbol for transmission during a third symbol period (e.g., wherein the FFE is a three or more tap FFE). The method 700 may further include transmitting, via the transmitter, the filtered data signal to the first signal line, at 730.

While the foregoing has included descriptions of a combination of FFEs configured to smear a pulse response and DFEs configured to remove ISI from the smeared pulse response to recover data, other transmit and receive equalizers may be implemented without departing from the scope of the disclosure. For example, FIG. 7 is a block diagram of a system 700 for communicating over a channel interconnect 720 via a transmit equalizer buffer EQTx 710 and a receive equalizer buffer EQRx 730 according to an embodiment of the present disclosure. The EQTx 710 may include a transmit buffer configured with an equalization circuit configured to smear a pulse response (e.g., spread pulse response energy across more than one symbol period). The EQRx 730 may include a receive buffer configured with an equalization circuit that removes some of the ISI introduced by the EQTx 710 to recover transmitted data. The channel interconnect 720 may include an interconnected between the EQTx 710 and the EQRx 730. In some examples, the channel interconnect 720 may be susceptible to crosstalk. Accordingly, the EQTx 710 may be configured to smear a pulse response of a signal transmitted to the EQRx 730 via the channel interconnect 720. Smearing the pulse response may increase ISI. The equalization circuit of the EQRx 730 may be configured to remove at least some of the ISI introduced by the pulse response smearing by the EQTx 710. In a specific example, the EQTx 710 may include a FFE and the EQRx 730 may include a DFE.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a plurality of data terminals each coupled to a respective signal line of a plurality of signal lines of a channel bus; and
   a transmitter coupled to the data terminals comprising a feed-forward equalizer (FFE) associated with a first signal line of the plurality of signal lines and configured according to a crosstalk interference characteristic of the channel bus, wherein the transmitter is configured to transmit a filtered data signal to a data terminal of the plurality of data terminals associated with the first signal line, and wherein the FFE is configured to receive a data signal corresponding to the first signal line of the plurality of signal lines and to spread pulse response energy across more than one symbol period to provide the filtered data signal.

2. The apparatus of claim 1, wherein the crosstalk interference characteristic of the channel bus includes interference induced on an adjacent channel of the channel bus.

3. The apparatus of claim 1, wherein the transmitter further comprises a second FFE associated with a second signal line of the plurality of signal lines and configured according to a second crosstalk interference characteristic of the channel bus; wherein the second FFE is configured to spread pulse response energy across more than one symbol period to provide a second filtered data signal.

4. The apparatus of claim 1, wherein the FFE is configured to apply a first coefficient to the pulse response energy of a symbol to provide a first filtered symbol for transmission during a first symbol period and apply a second coefficient to the pulse response energy of the symbol to provide a second filtered symbol for transmission during a second symbol period.

5. The apparatus of claim 4, wherein the first symbol period is a time period associated with the symbol and the second symbol period is a time period associated with a subsequent symbol.

6. The apparatus of claim 4, wherein the first and second coefficients are selected based on the crosstalk interference characteristic.

7. The apparatus of claim 4, wherein the first and second coefficients are both positive values.

8. The apparatus of claim 1, wherein the FFE includes at least two taps.

9. The apparatus of claim 1, further comprising a receiver coupled to the plurality of data terminals and comprising a decision feedback equalizer (DFE) configured to filter a receive signal received at the data terminal associated with the first signal line based on a set of previous symbol decisions to recover symbol data.

10. An apparatus comprising:
a memory die configured to receive write data from and to provide read data to a channel data bus having a plurality of signal lines; and
a logic die comprising a transmitter coupled to the channel data bus, the transmitter comprising a plurality of feed-forward equalizers (FFEs) each corresponding to a respective signal line of the plurality of signal lines of the channel data bus, wherein each of the plurality of FFEs is configured to spread pulse response energy across more than one symbol period based on crosstalk interference characteristics of the channel data bus to provide a respective filtered data signal.

11. The apparatus of claim 10, wherein the memory die includes a receiver coupled to the channel data bus, wherein the receiver comprises a plurality of decision feedback equalizers (DFEs) each configured to filter a respective one of the filtered data signals transmitted from the transmitter based on a respective set of previous symbol decisions to recover respective symbol data.

12. The apparatus of claim 10, wherein each of the plurality of FFEs is configured to spread respective pulse response energy of the respective symbol of a respective data signal across more than one symbol period increases intersymbol interference on the respective filtered data signal.

13. The apparatus of claim 10, wherein the crosstalk interference characteristics of the channel data bus are based on at least one of trace width for each signal line of the plurality of signal lines, trace separation between adjacent signal lines of the plurality of signal lines, trace arrangement of each signal line of the plurality of signal lines, a conductive material used for respective traces that form the plurality of signal lines of the channel data bus, or any combination thereof.

14. The apparatus of claim 10, further comprising a second memory die configured to receive second write data from and to provide second read data to a second channel data bus having a second plurality of signal lines connected to the logic die, wherein the logic die further comprises a second transmitter coupled to the second channel data bus configured to provide the second write data to and receive the second read data from the second memory die, wherein the second transmitter comprising a second plurality of FFEs each corresponding to a respective signal line of the second plurality of signal lines of the second channel data bus, wherein each of the second plurality of FFEs is configured to spread pulse response energy across more than one symbol period based on crosstalk interference characteristics of the second channel data bus to provide a respective filtered data signal, wherein the second transmitter is configured to transmit each of the respective filtered data signals to corresponding signal lines of the second plurality of signal lines of the second channel data bus.

15. A method comprising:
receiving a data signal corresponding to a first signal line of a plurality of signal lines of a channel bus at a feed forward equalizer (FFE) of a transmitter, wherein configuration of the FFE is based on a crosstalk interference characteristic of the channel bus;
spreading a pulse response energy of a symbol of the data signal across more than one symbol period via the FFE to provide a filtered data signal; and
transmitting, via the transmitter, the filtered data signal to the first signal line.

16. The method of claim 15, wherein spreading the pulse response energy of the symbol of the data signal across more than one symbol period via the FFE to provide the filtered data signal comprises:
applying a first coefficient to the pulse response energy of the symbol to provide a first filtered symbol for transmission during a first symbol period; and
applying a second coefficient to the pulse response energy of the symbol to provide a second filtered symbol for transmission during a second symbol period.

17. The method of claim 16, wherein the first symbol period is a time period associated with the symbol and the second symbol period is a time period associated with a subsequent symbol.

18. The method of claim 16, wherein the first and second coefficients are both positive values.

19. The method of claim 16, further comprising applying a third coefficient to the pulse response energy of the symbol to provide a third filtered symbol for transmission during a third symbol period.

20. The method of claim 16, further comprising selecting the first and second coefficients based on the crosstalk interference characteristic of the channel bus.

* * * * *